(12) United States Patent
De Vries et al.

(10) Patent No.: US 8,264,235 B2
(45) Date of Patent: Sep. 11, 2012

(54) TEST STRUCTURE FOR DETECTION OF DEFECT DEVICES WITH LOWERED RESISTANCE

(75) Inventors: Dirk Kenneth De Vries, St.-Georges-D'Orques (FR); Roberto Maurizio Gonella, Echirolles (FR)

(73) Assignee: NXP B.V., Eindhoven (NL)

( * ) Notice: Subject to any disclaimer, the term of this patent is extended or adjusted under 35 U.S.C. 154(b) by 604 days.

(21) Appl. No.: 12/447,511

(22) PCT Filed: Oct. 26, 2007

(86) PCT No.: PCT/EP2007/061537
§ 371 (c)(1),
(2), (4) Date: Apr. 28, 2009

(87) PCT Pub. No.: WO2008/052940
PCT Pub. Date: May 8, 2008

(65) Prior Publication Data
US 2010/0060292 A1  Mar. 11, 2010

(30) Foreign Application Priority Data

Oct. 30, 2006  (EP) ..................................... 06291691

(51) Int. Cl.
*G01R 31/08* (2006.01)
(52) U.S. Cl. ................ 324/525; 324/762.01; 324/750.3; 324/750.03; 438/17
(58) Field of Classification Search ................... 324/525
See application file for complete search history.

(56) References Cited

U.S. PATENT DOCUMENTS

| 5,006,808 | A  | * | 4/1991  | Watts ............................ 324/537 |
| 6,080,597 | A  | * | 6/2000  | Moon ............................. 438/17 |
| 6,323,097 | B1 | * | 11/2001 | Wu et al. ........................ 438/384 |
| 6,392,251 | B1 | * | 5/2002  | McCarthy et al. ............... 257/48 |
| 6,590,374 | B1 | * | 7/2003  | Har-Lev .......................... 324/66 |
| 6,972,576 | B1 | * | 12/2005 | Lyons et al. ................... 324/699 |
| 7,088,122 | B2 | * | 8/2006  | Hartmann et al. ....... 324/762.03 |
| 7,489,151 | B2 | * | 2/2009  | Hess et al. ................ 324/750.3 |

(Continued)

FOREIGN PATENT DOCUMENTS

EP  0430372 A1  6/1991

(Continued)

OTHER PUBLICATIONS

Bric, Allen J. "Imaging a BQM-74E Target Drone using Coherent Radar Cross Section Measurements", Johns Hopkins APL Technical Digest, vol. 18, No. 3 (1997), pp. 365-366.*

*Primary Examiner* — Timothy J Dole
*Assistant Examiner* — Benjamin M Baldridge (57) ABSTRACT

The present invention relates to a test structure that comprises at least two devices under test DUT, which respectively have a first electrical device resistance in a non-defect state and a second electrical device resistance in defect state, the first being higher than the second electrical device resistance. In the test structure the DUTs are connected in parallel to a first test contact pad via a first conducting line and connected in parallel to a second test contact pad via a second conducting line, and respectively connected to the first conducting line via respective first test resistors, which have known respective electrical test resistances, such that a total electrical resistance between the first an second test contact pads is indicative of the number of DUTs, which have the second electrical device resistance. The test structure allows testing a larger number of DUTs in parallel in a single measurement.

17 Claims, 5 Drawing Sheets

U.S. PATENT DOCUMENTS

| | | |
|---|---|---|
| 7,688,083 B2 | 3/2010 | De Vries et al. |
| 2002/0125890 A1* | 9/2002 | Kiribayashi et al. .......... 324/525 |
| 2002/0195706 A1 | 12/2002 | Irie |
| 2003/0006896 A1* | 1/2003 | Passwater ..................... 340/454 |
| 2005/0219034 A1* | 10/2005 | Yoshikawa ........................ 338/9 |
| 2005/0265009 A1* | 12/2005 | Fussinger et al. ............. 361/777 |
| 2006/0022695 A1* | 2/2006 | Barish et al. .................. 324/765 |
| 2006/0033073 A1 | 2/2006 | Ponder |
| 2006/0097729 A1* | 5/2006 | Brown et al. .................. 324/525 |
| 2006/0139047 A1* | 6/2006 | Zhou ............................. 324/763 |
| 2006/0192584 A1* | 8/2006 | Kang et al. .................... 324/765 |
| 2006/0202710 A1* | 9/2006 | Lin ................................. 326/30 |

FOREIGN PATENT DOCUMENTS

| | | |
|---|---|---|
| JP | 57 070469 A | 4/1982 |
| JP | 2005 257300 A | 9/2005 |

* cited by examiner

TEST STRUCTURE FOR DETECTION OF DEFECT DEVICES WITH LOWERED RESISTANCE

FIELD OF THE INVENTION

The invention relates to a test structure comprising at least two devices under test, hereinafter DUTs, which respectively have a first electrical device resistance in a non-defect state and a second electrical device resistance in defect state. The invention further relates to a substrate comprising at least one integrated circuit and one or more test structures a test method.

BACKGROUND OF THE INVENTION

In the production process of integrated circuits devices are tested to estimate the device yields and possible yield-detracting processing problems. Since the production of integrated circuits comprises many processing steps and different technologies, the technological sources of electrical failure such as short circuits within the integrated circuits or open contacts are investigated using test structures in order to estimate a suitable process window and to improve the device quality as well as the processing yield.

It is therefore desirable to detect, quantify and avoid yield detracting factors in integrated circuits. To achieve this quantification and detect corrupt device structures, test devices, hereinafter also called devices under test or, in short DUTs, are fabricated. Such test devices may comprise, for instance, contact or via chains, polycrystalline semiconductor lines or metal lines, and/or poly crystalline semiconductor combs or metal combs.

In known prior-art solutions each device under test has its respective test contact pads, and each device has to be tested sequentially by placing probe contact needles on the respective contact pads. This mechanical movement is very time-consuming, and due to the large number of test contact pads a correspondingly large area of the substrate is consumed. Additionally, the testing equipment needed for this testing operation needs complex control circuitry to enable a precise movement of the probe contact needles from one pair of test contact pads to the next. It is therefore desirable to reduce the number of test contact pads.

US2006/0022695 discloses arranging several devices under test in a matrix. Individual devices are addressed by selecting the row and the column of the device. Thus less connection pads have to be used. However, a switching step is required to address the specific device under test. Testing still involves sequentially probing all DUTs of the test structure.

U.S. Pat. No. 6,392,251 discloses a test structure for identifying defect vias, which form open contacts in a network of vias. Via pairs are respectively connected in parallel to two common test contact pads through respective series test resistors that have known electrical resistances and known locations. Defect vias forming open contacts can be identified with a single resistance measurement between the two test contact pads, because the respective serial test resistor adjacent to each via has a known electrical test resistance. However, identifying an open of a via as in U.S. Pat. No. 6,392,251 requires a repetitive "trial-and-error" calculation of different test resistor combinations and a subsequent comparison with the measured total electrical resistance.

It would be desirable to test other DUTs than vias with a single measurement. It is also desirable to detect other defect states than undesired contact openings. Since other critical processing steps than the formation of the vias have to be undertaken during the production of an electrical device, it is desirable to obtain a view on achieved device quality, which is for instance indicated by a number of defect devices comprised in a test structure. It is also desirable to be able to investigate a process window, which may include determining the limitation of the technologically achievable accuracy.

SUMMARY OF THE INVENTION

According to a first aspect of the invention a test structure is provided that comprises at least two devices under test, hereinafter DUTs, which respectively have a first electrical device resistance in a non-defect state and a second electrical device resistance in a defect state, the first electrical device resistance being higher than the second electrical device resistance.

In the test structure of the first aspect of the invention,
the DUTs are connected in parallel to a first test contact pad via a first conducting line and connected in parallel to a second test contact pad via a second conducting line, and
respective first test resistors are connected in series between the respective DUTs and either the first or second conducting line, the first test resistors having known respective electrical test resistances, such that a total electrical resistance between the first an second test contact pads is indicative of the number of DUTs, which have the second electrical device resistance.

The DUTs in test structure of the first aspect of the invention can be tested in parallel in a single measurement by measuring the electrical resistance or electrical conductance between the first and second test contact pads.

The test structure of the first aspect of the invention has been defined in terms of the electrical resistances of its components, such as the first and second device resistances, the test resistance, and the total resistance between the test contact pads. This is to be understood in a non-restrictive manner. The test structure can equivalently be defined using any physical quantity that is in a well-defined mathematical relationship to the electrical resistance. For instance, the electrical conductance could be used. The electrical conductance forms the inverse of the electrical resistance. As an example of a corresponding definition, the first electrical device resistance in the non-defect state, which is higher than a second electrical device resistance in the defect state, can equivalently be expressed as a first electrical device conductance in the non-defect state, which is lower than a second electrical device conductance in the defect state. Another suitable quantity is the electrical impedance, which can be represented by a complex number, the real part of which forms the (Ohmic) electrical resistance. Other examples of suitable physical quantities can be used, and are known to a person of ordinary skill in the art.

The test structure of the first aspect of the invention is useful for many different types of devices under test and thus achieves a far broader field of application than for instance the prior-art solution of U.S. Pat. No. 6,392,251, which is restricted to testing vias for opens, that is, undesired electrical contact interruptions introduced by vias.

In addition, and in further contrast to U.S. Pat. No. 6,392,251, the test structure of the first aspect of the invention is configured to allow detecting a lowering of an electrical device resistance from a first electrical device resistance to a lower second electrical device resistance. The electrical device resistance is an electrical resistance of the device under test. Defect states with a lowered electrical resistance in comparison to the non-defect state, such as electrical shorts, form dangerous sources for a malfunctioning of integrated circuits. Due to high current densities involved, electrical shorts produce large amounts of heat that can be very destructive and pose a severe safety risk.

In the test structure of the first aspect of the invention, the DUTs are respectively connected to the first conducting line via respective first test resistors, which have known respective electrical test resistances. Different DUTs are connected in parallel to a first test contact pad via a first conducting line and connected in parallel to a second test contact pad via a second conducting line. The test resistance values are suitably chosen, such that a total electrical resistance between the first an second test contact pads is indicative of the number of DUTs, which have the second electrical device resistance. This way, an indicator of the achieved device quality can be provided in a fast and simple measurement process. A suitable choice of test resistance values may depend on a particular testing equipment used and on the nature of DUTs used.

The test structure of the invention makes use of the recognition that in many applications a number of defect devices suffices to define a suitable process window or structural device-parameter window, and to predict the structural integrity of other DUTs in the test structure with known device parameters inside or outside of the suitable device-parameter window. For instance, transistors with endcaps that have an extension below a certain threshold extension will always exhibit a lower device resistance in their off-state due to increased current leakage. In order to determine a threshold endcap extension that is suitable for correct operation, it suffices to determine the number of defect structures with a low resistance, given a known total number of DUTs and an extension-variation amount of the endcap extension from DUT to DUT.

The term "test contact pad" shall be construed as including all types of electrical contact structures, examples being formed by probe pads, in particularly those adapted to be contacted by a probe needle, which delivers an electrical contact for a limited time span according to the duration of a measurement.

In the following, preferred embodiments of the test structure of the first aspect of the invention will be described. The embodiments can be combined with each other to form additional embodiments, unless explicitly stated otherwise or obvious from the nature of the specific additional limitations of a given embodiment.

The defect state of a DUT according to the first aspect of the invention is considered to be a state with a lower ("second") electrical device resistance in comparison with a higher ("first") electrical device resistance in the non-defect state, irrespective of the particular nature of the defect. For instance, in some embodiments the defect state is related to a short circuit (also referred to as "short") present in the respective DUT. However, in other embodiments and in contrast to the rather extreme example of a short, any undesired lowering of the device resistance in comparison to a non-defect state, for instance due to an undesired change of material composition in an otherwise intact DUT structure, is considered a defect state.

In one embodiment, respective second test resistors are connected in series between the respective DUTs and the other of the first or second conducting lines. The second test resistors having known respective electrical test resistances. In this embodiment, the respective electrical test resistance is split in two parts. This embodiment allows an easier layout in certain applications than the use of a single test resistor.

In one embodiment the electrical test resistance of the test resistors is lower than the first electrical device resistance of a respective DUT connected therewith, and higher than the second electrical device resistance of the respective DUT, which it assumes in the defect state.

In one embodiment, a respective DUT and the respective first test resistor together form a respective test branch of the test structure. Different test branches are connected in parallel to the first and second conducting lines. Notably, each test branch contains only one DUT. The test structure of this embodiment thus contains as many parallel test branches as there are DUTs in the test structure. This test structure has a particularly flexible structure, which can be adapted to a large number of different DUT structures.

In another embodiment, the conducting lines have a main direction of extension, which is referred to as the longitudinal direction. For an embodiment that has parallel and rectilinear first and second conducting lines, the longitudinal direction is obvious. For other geometrical shapes of the first and second conducting lines, the longitudinal direction is the direction, in which the respective conducting line has its largest lateral extension. The first and second conducting lines are preferably arranged on an identical level in the test structure, i.e., with an identical distance from a reference plane, which can for instance be a hypothetical perfectly flat substrate surface. In this embodiment, different DUTs, or, in the wording of the previous embodiment, different test branches are preferably arranged sequentially along the longitudinal direction. This systematic arrangement allows a simple localization of defect devices for a closer defect analysis. The DUTs and the respective test resistors can for instance be laterally arranged between the first and the second conducting lines.

Preferably, the respective first and second test resistors, which are connected in series to a respective DUT, have either identical or nearly identical electrical test resistances. This embodiment is particularly suitable for the detection of so-called systematic failure mechanisms.

In a further preferred embodiment, which is suitable in particular for a combination with the last foregoing embodiment, the DUTs of the test structure have at least one structural element in common. This structural element has, however, a structural feature that differs between the different DUTs. Both terms "structural element" and "structural feature" refer to a layout attribute of a DUT. Generally, for the definition of this embodiment, the term "structural element" is used to denote a layout attribute that is superordinate to what is referred to as a "structural feature".

By way of an illustrative example, without restriction to the scope of the present embodiment, in a series of DUTs in the form of comb-comb structures a common structural element is formed by interdigitating conductive lines. The distance between two respective neighboring interdigitating conductive lines, one from each comb of the comb-comb structure, forms an example of a structural feature that can, according to the present embodiment, vary between the different DUTs. That is, in this example of a test structure, a plurality of comb-comb structures (DUTs) is provided, different DUTs having neighboring interdigitating conductive lines with changing distances between each other. The distances may for instance decrease from one DUT to the next, thus covering a distance interval for the assessment of a suitable process window.

The use of identical or nearly identical electrical test resistances for a detection of systematic failure mechanisms has the advantage that it is particularly simple to fabricate. Reference is made in this context to the above example of DUTs in the form of single transistors where endcaps form a common structural element with varying thickness differing as the structural feature, a source-drain current in an off-state of the transistors is a measure of the device resistance.

Transistors form examples of DUTs, which have three terminals for electrical connection: source, drain, and gate in the case of field effect transistors, or emitter, collector, and base in the case of bipolar transistors. In an embodiment, where the DUTs have three terminals, the first and a second terminals of the DUTs are respectively connected with the first and second conducting lines, respectively. This connection involves either the first or the first and the second test resistors, as described before. In addition, third terminals of the DUTs are connected in parallel to a control contact pad of the test structure.

In another embodiment, the test resistors in series to the DUTs have different known electrical test resistances for different DUTs, such that the total electrical resistance between the first and second test contact pads is additionally indicative of each individual DUT, which has the second electrical device resistance. This embodiment is an alternative to the previously mentioned embodiment that uses identical test resistances for the test resistors. It is particularly suitable for an application in which random-failure mechanisms occur, i.e., in which a failure of a DUT will have a rather low predictive power for the presence of a defect or non-defect state of other, in particular the neighboring DUTs.

An advantage of the test structure of the present embodiment in comparison with a test structure for identifying opens as disclosed in U.S. Pat. No. 6,392,251 is that it is simpler to identify the defect DUTs from the total electrical resistance of the test structure for any combination of defect DUTs in the test structure. For the test structure of the present embodiment enables determining the number of defect DUTs by measuring a current flow through the test structure between the test contact pads at a given voltage between the test contact pads. Each DUT in the defect state raises the current flow by a step determined by the electrical test resistance of the test resistor. In contrast, identifying an open of a via as in U.S. Pat. No. 6,392,251 requires a repetitive calculation of different test resistor combinations and a subsequent comparison with a measured total electrical resistance. This is due to the fact that in case of an open of a via the total electrical resistance increases.

Particularly in this embodiment, it is advantageous that the respective first electrical test resistances of the first test resistors in series to the DUTs increase by an integer factor for different DUTs, respectively. For instance, the factor can be 2, but higher values, in particular higher integer values are possible. In this embodiment, the first electrical test resistances provide a "coding" of the respective DUTs by the assignment of a respective test resistor of a specific known electrical test resistance different from the other test resistors to a respective DUT of the test structure. A factor of at least 2 has the further advantage of de-correlating a simultaneous occurrence of shorts on multiple DUTs.

In embodiments with first and second test resistors, as previously described, the respective second electrical test resistances of the second test resistors in series to the DUTs preferably also increase by an integer factor for different DUTs, respectively. This integer factor is in some embodiments identical to that used for the first test resistances.

To allow an easy detection of defect DUTs, the total electrical resistance should be significantly higher in case that none of the DUTs is in the defect state, in comparison with a case, in which only one DUT is in a defect state. Preferably, the first electrical device resistance of a respective DUT differs from the second electrical device resistance of the same respective DUTs at least by a factor 1000. This large difference is simple to detect. It applies for instance in case of a defect state formed by a short in a DUT. In this case, the DUT has a very low electrical resistance and the total electrical resistance is then nearly identical to the first (plus, if present, the second) test resistance associated with the specific DUT. This defect DUT is therefore easily identified by a measurement of the total resistance. In case two or more DUTs are in a defect state the total resistance is even lower and can be calculated by reciprocal addition of the electrical resistances.

In another preferred embodiment the defect state of the DUT is such that the DUT comprises at least one pn junction or metal to semiconductor contact and that the pn junction or metal to semiconductor contact is not blocking current flow sufficiently in its blocking direction, being reverse biased.

There is no fundamental limitation to a maximum number of DUTs in a test structure. Some embodiments comprise 3 to 10 DUTs. However, as mentioned, other embodiments comprise 10000 DUTs. Higher numbers of DUTs introduce a higher complexity of evaluation of the test measurement.

According to a second aspect of the invention, a substrate is provided that comprises at least one integrated circuit and one or more test structures according to the first aspect of the invention or one of its embodiments described hereinbefore and hereinafter.

The substrate of the second aspect of the invention shares the advantages of the test structure of the first aspect of the invention.

In a preferred embodiment the substrate takes the form of a wafer as used in the production of integrated-circuit devices for electronic applications. The test structures are typically arranged outside an area used for integrated-circuit devices.

The use of different test structures on a substrate allows covering a larger range of values of a test parameter, for instance a line spacing. A first test structure can cover a first partial range of test parameter values, a second test structure a neighboring second partial range of test parameter values etc.

According to a third aspect of the invention, a test method is provided. The test method comprises:
providing one or more test structures according to the first aspect of the invention or one of its embodiments described hereinbefore and hereinafter;
measuring a test quantity that is dependent on the total electrical resistance between the first and the second test contact pads of the test structure;
determining the number of DUTs, which have the second electrical device resistance, from a measured test-quantity value.

The test method of the present aspect of the invention shares the advantages of the test structure of the first aspect of the invention. It further allows the use of a simple and therefore inexpensive test equipment.

Preferably, performing a measurement of a test quantity comprises measuring a current flow between the first and second test contact pads at a given voltage between the first and second test contact pads.

In one embodiment, determining the number of DUTs, which have the second electrical device resistance, comprises:
providing one or more test structures according to the first aspect of the invention or one of its embodiments described hereinbefore and hereinafter, wherein test resistors of the test structures have the same electrical test conductance;
determining a total electrical conductance between the first and the second test contact pads from the result of the measurement;
subtracting electrical test conductances of the first test resistors one by one from the total electrical conductance, leading to a respective difference conductance value in each subtracting step;

raising a count index number by 1 for each subtracting step until the difference conductance value equals zero within a given measurement precision.

Another embodiment comprises:

providing a test structure according to the first aspect of the invention or one of its embodiments described hereinbefore and hereinafter, wherein the DUTs have three terminals, a first and a second terminal being connected with the first and second conducting lines, respectively, and third terminals of the DUTs being connected in parallel to a control contact pad of the test structure; and applying a control quantity to the control contact pad and varying the control quantity during the measurement of the test quantity.

This test method is suitable for testing a functional parameter like an "on" voltage of a transistor for a large number of DUTs with one single sweep of the control quantity.

Another embodiment comprises:

providing one or more test structures according to the first aspect of the invention or one of its embodiments described hereinbefore and hereinafter, wherein the test resistors in series to the DUTs have different known electrical test resistances for different DUTs, such that the total electrical resistance between the first and second test contact pads is additionally indicative of each individual DUT, which has the second electrical device resistance.

measuring a test quantity that is dependent on the total electrical resistance between the first and the second test contact pads;

determining the individual DUTs, which have the second electrical device resistance, from a measured test-quantity value.

In this embodiment, determining the individual DUTs preferably comprises:

if the test quantity is not the electrical conductance, calculating an electrical test-conductance value from the measured test-quantity value;

ascertaining a DUT, which has a first electrical device conductance value allocated to its non-defect state, which first conductance value is the largest from a subset of DUTs of the test structure, which have smaller first conductance values than the test-conductance value, and storing or outputting an identifier of the respective DUT;

subtracting the largest first-conductance value used in the foregoing ascertaining step from the test-conductance value to ascertain a rest-conductance value;

repeating the ascertaining step using the rest-conductance value in the position of the test-conductance value, until the calculated rest-conductance value exactly or approximately reaches zero.

Further embodiments are defined in the dependent claims.

Further below, exemplary embodiments will be described in more detail with reference to the Figures, which will be briefly summarized in the following.

DETAILED DESCRIPTION OF EMBODYMENTS

Figure 1:
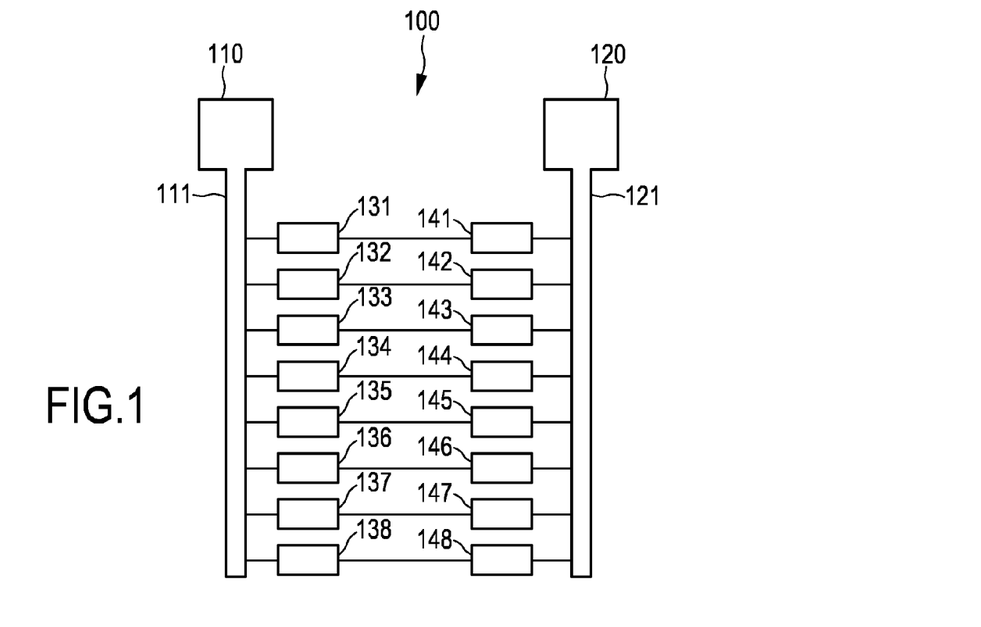
FIG. 1 illustrates a first embodiment of a test structure.

FIG. 1 shows a schematic view of an embodiment of a test structure 100. The test structure 100 comprises a first test contact pad 110, which is connected with a first conducting line 111. Furthermore, the test structure 100 comprises a second test contact pad 120, which is connected with a second conducting line 121. The first and second conducting lines 111 and 121 are parallel to each other and rectilinear, and preferably arranged on an identical metal level. DUTs 131 to 138 branch off in parallel from the first and second conducting lines 111 and 121.

The DUTs are shown as blocks in the schematic representation of the test structure of FIG. 1. The DUTs may take the form of, for example, comb-comb structures, diodes, transistors, varistors, capacitors etc. The DUTs are drawn as 2-terminal devices in FIG. 1. However, the can contain dependent or independent additional terminals. More specific examples of DUTs will be given below in FIG. 2 and FIG. 3 and the pertaining description. An example of a test structure with 3-terminal DUTs will be given in FIG. 8.

It is common to all variants of DUTs, that they exhibit a first electrical device resistance in a non-defect state, and a second electrical device resistance, which is lower than the first electrical device resistance, in a defect state. Note however, that in other test structures outside the scope of the present invention this relation may be inverted.

Each DUT 131 to 138 is connected in series to a respective test resistor 141 to 148. The test 141 to 148 resistors are provided downstream of the respective DUTs 131 to 138 on a respective conducting path between the first the second conducting lines. A respective test restistor 141 to 148 and a respective DUT 131 to 138 connected in series with the respective test resistor together form a test branch of the test structure. The different test branches are connected in parallel to the first and second conducting lines 111 and 121, respectively.

During operation of the test structure 100 of FIG. 1, a conductance measurement or a resistance measurement is performed. In a conductance measurement, a voltage difference is applied across the test structure and the current flowing through the test structure is measured. In a resistance measurement, a pre-set amount of current is passed through the test structure and the voltage between the test contact pads is measured. As is well known, the electrical conductance, in units of Siemens, is the inverse of the electrical resistance, in units of Ohm, and a computational conversion between the two test quantities can easily be performed if desired.

For the following explanation, it will be assumed for illustrative purposes that a conductance measurement is performed. It is further assumed for simplicity of explanation that the DUTs in their non-defect state have an infinite resistance or zero conductance. On the basis of a suitable selection of test resistance values for the test resistors, the total conductance between the test contact pads 110 and 120 will significantly vary from an expected total conductance value present if all DUTs are in a non-defect state. This expected total conductance value is 0 Siemens in the present case. If one single DUT is in a defect state, for example exhibiting a short, a series conductance formed by the inverse of the sum of the respective second electrical device resistance of the respective DUT and a test resistance of its associated test resistor will be equal to the test conductance, that is, the inverse of the test resistance, assuming that the second electrical device resistance in the case of a short is negligible. The measured total conductance between the test contact pads is thus determined by the test conductance associated with the defect DUT.

Should more DUTs be in the defect state, the total conductance measured is given by a parallel network of the test conductances associated with DUTs in the defect state, i.e., the sum of the respective test conductances.

In case all test resistors are equal, one can determine the number of DUTs in the defect state from the measurement of the total conductance. However, by choosing test resistors with significantly varying test conductances, such that the measured sum of test conductances is unique for each possible combination of defect DUTs, it is possible to identify the defect DUTs on the basis of a single analogue conductance measurement. The identification can be performed using a look-up table that allocates one or more DUT identifications to a respective conductance value, or by following an algorithm, examples of which will be described below with reference to FIGS. 6 and 7.

Thus, a single measurement allows detecting all DUTs in a defect state, which is time effective. Furthermore, only one pair of test contact pads is required, which keeps the substrate area consumption of the test structure low.

Figure 2:
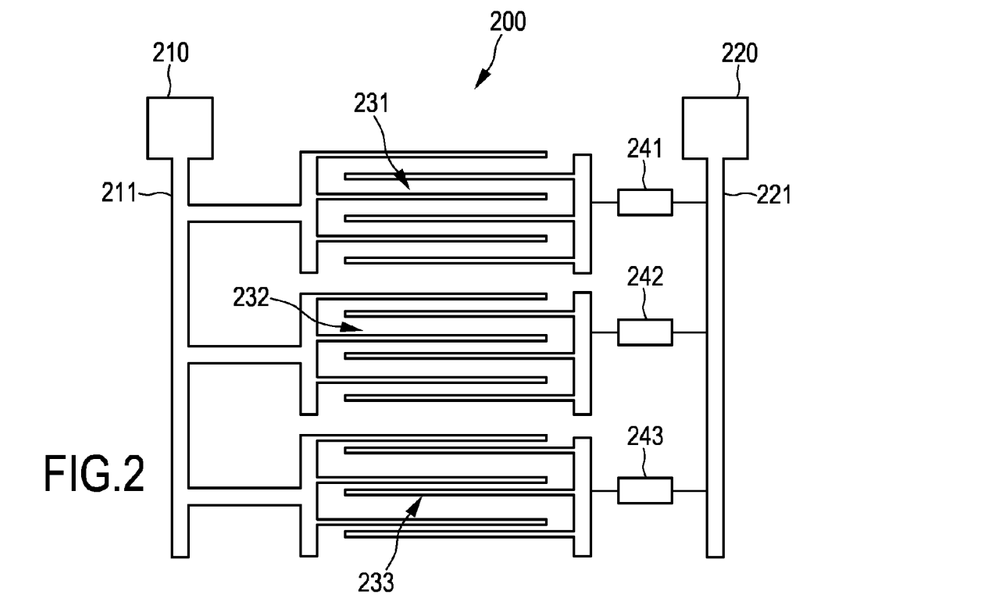
FIG. 2 illustrates a second embodiment of a test structure.

FIG. 2 shows a schematic view of an embodiment of a test structure 200. The test structure 200 comprises a first test contact pad 210, which is connected with a first conducting line 211. Furthermore, the test structure 200 comprises a second test contact pad 220, which is connected with a second conducting line 221. DUTs 231 to 233 branch off in parallel from the first conducting line 211.

The DUTs 231 to 233 are comb-comb structures, which comprise two comb structures, each comb structure comprising three conducting comb lines extending in a direction perpendicular to the first and second conducting lines 211 and 221. The three comb lines of each comb structure are electrically connected with each other through a comb backbone, which extends parallel to the conducting lines 211 and 221. The comb lines of the two combs are facing each other and arranged in an interdigitating manner, such that each comb line has at least one neighboring comb line belonging to the other comb structure.

Neighboring comb lines are arranged at a distance from each other. Different comb-comb layouts have different yield-loss sensitivities, leading to, for example, a minimum space structure failing on 10% of the measured sites, and a relaxed space structure failing on 5% of the measured sites.

The distance between neighboring comb lines decreases from comb-comb structure 231 to comb-comb structure 233. In the comb-comb structures the distance of one comb line to the two comb lines arranged neighboring on both sides and belonging to the other comb structure is approximately equal, whereas this balanced interdigitating arrangement becomes biased with the comb-comb structures 232 and 233, moving respective comb line pairs closer together on on side and farther apart on the other side. Thus, the DUTs are ordered by increasing sensitivity to the yield loss mechanism that is to be captured by the test structure, namely, the inter-comb-line spacing. The smallest spacing will have the highest yield-loss sensitivity to shorts.

In the test structure 200, the comb-comb structures 231 to 233 are connected to the second conducting line through respective test resistors 241 to 243, which are switched in serial connection between the comb-comb structures and the second conducting line. The test resistors have different electrical test resistances, the electrical test resistances being raised by factor of 2 from a first test resistance R of the first test resistor 241, via a second electrical test resistance 2R of the second test resistor 242 and a factor 4 of the third test resistance 243. This way, the test resistors' identity can be coded by their respective electrical resistance, which enables identifying an individual resistor and, thereby, a respective connected DUT, which is in a defect state, by a single measurement of the total electrical resistance of the test structures between the pads 210 and 220, covering all the DUTs in parallel. Defect DUTs can be detected because any combination of defect DUTs and DUTs in a non-defect state produces an individual total electrical resistance, which cannot be produced by another combination of DUTs in a defect and a non-defect state within the test structure.

Note that the design parameter to be varied between the different DUTs can be another structural or compositional parameter known in the art. For instance, if the space between the comb lines is kept constant, dummy structures of varying width and/or density can be placed in an underlying metal layer. Depending on the technology, wider underlying metal will typically increase the sensitivity of the upper metal layer to shorts. These shorts are potentially due to a number of causes, such as copper hillocks on the underlying metal leading to patterning defects on the upper level, copper rip-outs on the underlying metal level leading to copper puddles on the upper level, and copper dishing on underlying metal leading to metallic residues of copper of a barrier on the upper level.

The occurrence of a short on a more sensitive DUT will not mask the occurrence of a short on a less sensitive DUT. For if a ratio between different test resistances is selected sufficiently large, it is guaranteed that the sum of parallel conductances on a set of more sensitive test structures is smaller than the conductance of a less sensitive test structure.

Other examples test structures may vary an endcap extension of a transistor, an inter-electrode distance of a capacitor, an extension of a pn junction of a diode etc.

Figure 3:
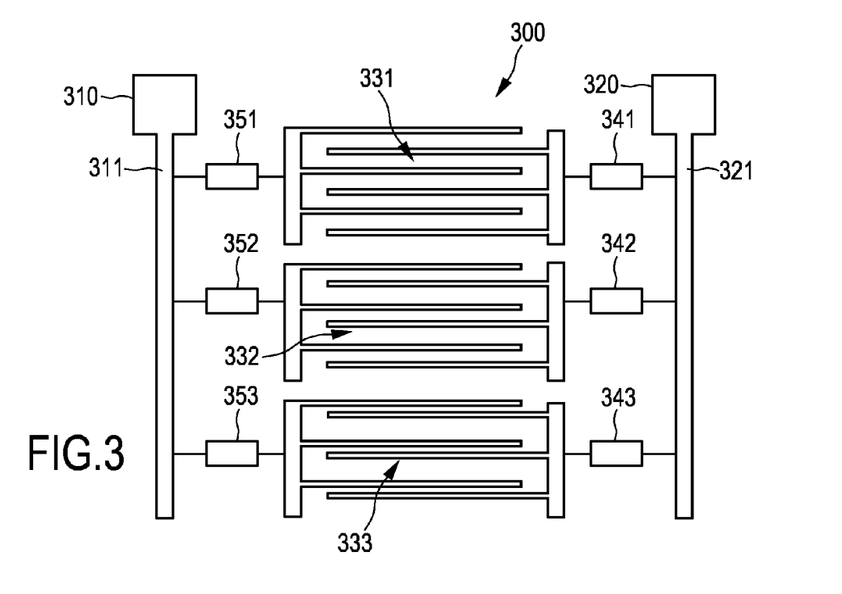
FIG. 3 illustrates a third embodiment of a test structure.

FIG. 3 shows another test structure 300 that forms an embodiment of the invention. This embodiment is substantially identical to the embodiment of FIG. 2. Therefore, reference labels with identical last two digits are used for like parts in comparison with FIG. 3. The following description focuses on differences in comparison with the embodiment of FIG. 2.

DUTs 331 to 333 in the form of comb-comb structures are in the present embodiment connected in series between two respective electrical test resistors, namely, first electrical test resistors 331 to 333 and second electrical test resistors 341 to 343. The two test resistors allocated to a respective DUT can for instance have the same electrical test resistances, respectively.

Figure 4:
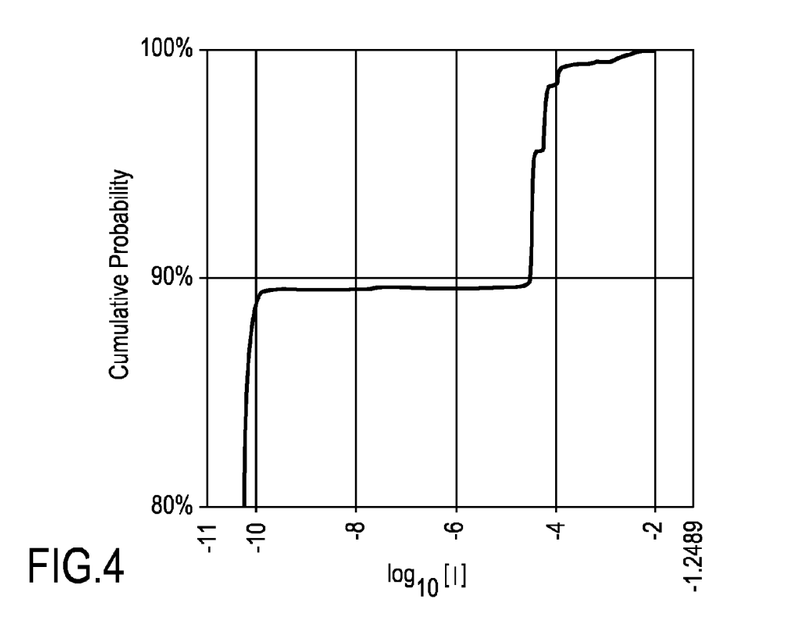
FIG. 4 is a diagram showing a parametric test measurement results from a test structure with 7 comb-comb sub-devices.
Figure 5:
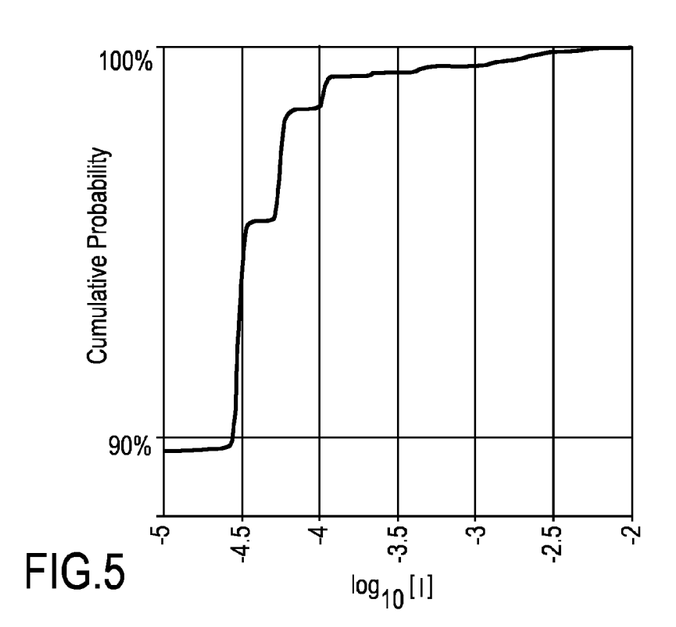
FIG. 5 is a magnified view of the diagram of FIG. 4.

FIG. 4 shows a diagram with experimental parametric test results of a test structure with 7 comb-comb structures as DUTs. The diagram shows a cumulative probability in a linear scale on its ordinate, as a function of the decadic logarithm of a leakage current in Amperes on the abscissa. FIG. 5 is a magnified view of the diagram of FIG. 4. Both FIGS. 4 and 5 will be described in parallel in the following.

A leakage current level below 100 pA, corresponding to a value of −10 on the abscissa, is indicative of a situation, in which there is no short circuit in any of the DUTs of the measured test structure. "Vertical plateaus" visible in FIGS. 4 and 5 correspond to the presence of a short circuit in at least one of the 7 sub-devices:

The most sensitive structure (with the largest yield loss sensitivity) has in this exemplary case the largest electrical test resistance, and therefore the lowest leakage current. The three most sensitive DUTs show significant yield loss. The 4 less sensitive sub-devices also show distinguishable, but small plateaus. In this way, yield loss as a function of the layout attribute that has been varied between the DUTs can be accurately quantified and modeled with a single parametric measurement per test structure.

Figure 6:
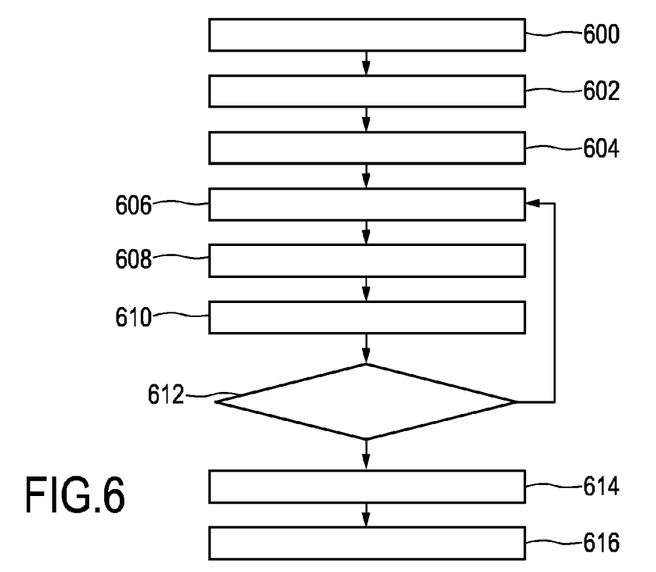
FIG. 6 shows a flow diagram of an embodiment of a test method for determining individual DUTs, which are in a defect state.

FIG. 6 shows a flow diagram of an embodiment of method for identifying individual DUTs, which have the second electrical test resistance. The algorithm performed is as follows:

A step 600 comprises providing a test structure. Embodiments of test structures have been described hereinabove.

A step 602 comprises storing the electrical test resistances of the test resistors and storing the corresponding DUTs identity in an identity list, hereinafter IDL. Typically, the test resistances of test resistors are known in sufficient accuracy from a layout library used for fabricating the test structure. Thus, current flows $F_m(V)$ through the test resistors with index m at a given applied voltage between the test contact pads can be predicted using Ohm's law, and for instance have been stored in a look-up table for one or several possible applied voltages. Therefore, an individual measurement of the test resistors is usually not required before the actual testing.

A step 604 comprises measuring a current flow between the two test contact pads and storing the measured value. This may for instance comprise providing a current source, measuring the current flow at a given voltage V between the test contact pads, and storing a value of the measured current flow in a current-flow variable I. The voltage is for instance applied by positioning probe needles on the test contact pads.

Subsequently, that the measured value stored in the current-flow variable I is evaluated. Assuming for the present example that it is smaller than expected for the case of only non-defect DUTs, which can be checked in a separate step not shown here, a step 606 comprises ascertaining a greatest current-flow value of a test resistor, which current flow is lower than or equal to the stored value of the current-flow variable I. Expressed as a formula, "max $(F_m \leq I)$" is ascertained. This may happen by accessing the identity list and finding the greatest current flow $F_m$, which is lower or equal to the current flow I, on the basis of Ohm's law or by searching in the mentioned look-up table.

A step 608 comprises storing an identifier of the test resistor corresponding to the partial current flow $F_m$ in an identifier list L. The identifier list L is thus used to store the identifiers of all presently detected test resistors.

A step 610 comprises subtracting the ascertained partial current flow value $F_m$ from the current-flow variable I. The step also comprises storing the resulting new value of variable I.

A step 612 comprises checking whether I is larger than zero within a testing accuracy. The testing accuracy accounts of values of I that are so small, that no partial current flow is smaller than a current variable I. If I is larger than zero, the method branches back to step 608. If not, a step 614 is performed that comprises outputting the list L with the identified test resistors/DUTs.

A step 616 then comprises identifying the DUTs, which have the second electrical device resistance. This is done by translating the identified test resistors of the list L to their corresponding DUTs, for instance on the basis of an access to the identity list IDL. The corresponding DUTs' identifiers can then be stored in the result list L.

Figure 7:
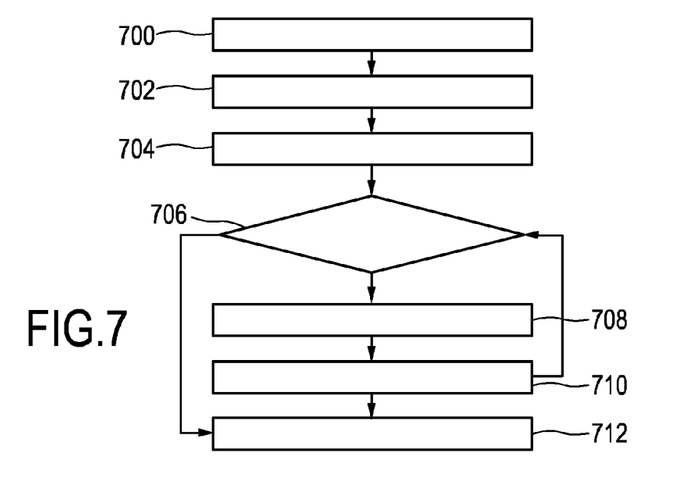
FIG. 7 shows a flow diagram of an embodiment of a test method for determining a number of DUTs, which are in a defect state.

FIG. 7 illustrates an alternative method embodiment, in which only the number of DUTs, which have the second electrical device resistance, has to be determined. The method has the following steps:

A step 700 comprises providing a test structure according to the first aspect of the invention of one of its embodiments.

A step 702 comprises storing the common electrical test resistance value of the test resistors. Thus, the current flow F(V) through any of the test resistors at a given applied voltage between the test contact pads can be predicted using Ohm's law, and for instance have been stored in a look-up table for one or several possible applied voltages.

A step 704 comprises measuring the current flow between the test contact pads and storing its value in a current-flow variable I, as described for step 604 of the embodiment of FIG. 6.

A step 706 comprises comparing the expected current flow F through a test resistor with the measured current-flow value I. This is for instance performed by subtracting F from the current value of I and storing the result as a new value of I.

If the measured current-flow value is larger (I>0), the method continues with a step 708, which comprises raising a count index related to a number DUTs with the second electrical device resistance by one. If, on the other hand, the current-flow variable I assumes the value zero or less (I≦0) within a given accuracy the method jumps immediately to step 712 below. If this occurs during the first run of step 706, all DUTs are in their non-defect state.

During the second and any further run of steps 706 and 708, partial current flows are further subtracted and thus, step-by-step, the number of DUTs is ascertained, which have the second electrical device resistance.

The step 712 then comprises count index, i.e., outputting the number of DUTs with the second electrical device resistance.

It should be noted that the determination of the number of DUTs or of the individual DUTs, which have the second electrical device resistance, can be carried out by using other algorithm than the proposed ones. For example, every combination of test resistors and its corresponding overall electrical resistance between the test contact pads can be calculated beforehand and then be compared with the measured over all electrical resistance. Note that this has the disadvantage that a larger number of values have to be calculated.

Figure 8:
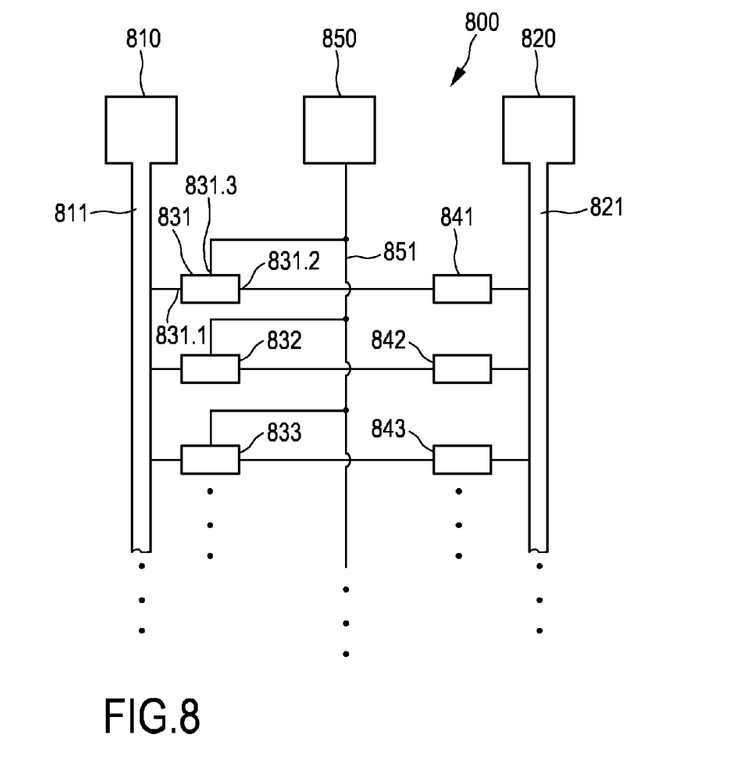
FIG. 8 illustrates a fourth embodiment of a test structure.

FIG. 8 illustrates a fourth embodiment of a test structure 800. The test structure 800 resembles that of FIG. 1 in many aspects. It comprises a first test contact pad 810, which is connected with a first conducting line 811. Furthermore, is comprises a second test contact pad 820, which is connected with a second conducting line 821. The first and second conducting lines 811 and 821 are parallel to each other and rectilinear, and preferably arranged on an identical metal level. Test branches with respective DUTs 831 to 833 and test resistors 841 to 843 branch off in parallel from the first and second conducting lines 811 and 821. The DUTs have three terminals, shown by way of example as a first terminal 831.1, a second terminal 831.2 and a third terminal 831.3 of the DUT 831. Continuing the description with reference to this example, the first and a second terminals 831.1 and 831.2 of the DUTs are respectively connected with the first and second conducting lines 811 and 821, respectively. This connection involves the series connection with the test resistor 841, as described before. In addition, the third terminals of the different DUTs 831 through 833 are connected in parallel to a control contact pad 850 of the test structure 800. This connection is provided via a third conducting line 851, which branches off to the respective DUTs.

As an example, the test structure 800 is assumed to have 10000 nominally identical field effect transistors forming the DUTs, only three of which are shown in the present Figure. The source and drain contacts form the first and second terminals 831.1 and 831.2 of the DUTs, and gate contacts form the third terminals 831.3. The gate contacts 831.3 of the field-effect transistors are thus connected in parallel to the control contact pad 850. In series with each source or drain contact, there is a large respective test resistor of, e.g., 10-100 kOhm.

A measurement of the analog response of this test structure as a function of gate voltage applied via the control contact pad to the gates of all DUTs will indicate how many devices are "on" at the given gate voltage and how many are "off". That means, with a single voltage sweep applied to the control contact pad one can obtain a complete threshold voltage distribution of the population of individual field-effect transistors. This is particularly relevant in 65 nm CMOS technology and below, where transistor variation and matching are for instance important for SRAM memory yield.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. The device under test can form a part of a larger device. A test structure can also contain DUTs, which respectively have a first electrical device resistance in a non-defect state and a second electrical device resistance in defect state, the first electrical device resistance being lower than the second electrical device resistance.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

Any reference signs in the claims should not be construed as limiting the scope.

The invention claimed is:

1. A test structure comprising:
    at least two devices under test, both including a first electrical device resistance in a non-defect state or a second electrical device resistance in a defect state, the first electrical device resistance being higher than the second electrical device resistance, wherein
    the devices under test are connected in parallel to a first test contact pad via a first conducting line and connected in parallel to a second test contact pad via a second conducting line, wherein
    respective first test resistors are connected in series between the respective devices under test and either the first or second conducting line, the first test resistors having known respective electrical test resistances, such that a total electrical resistance between the first and second test contact pads is indicative of the number of devices under test, wherein the test structure further comprises respective second test resistors connected in series between the respective devices under test and the first or second conducting line,
    wherein a current flow between the first and second test contact pads is measured at a given voltage between the first and second test contact pads, wherein a number of devices under test, which have an electrical device resistance indicating a defect state, is determined from a measured test-quantity value,
    wherein a particular device under test is found such that a current flow corresponding to the particular device under test is the largest from a subset of devices under test of the test structure, wherein the current flow corresponding to the particular device under test is smaller than the measured current flow, and wherein an identifier of the respective device under test is stored or output,
    wherein a difference value is generated by subtracting the current flow corresponding to the particular device under test from the measured current flow, and
    wherein the finding of the particular device under test is repeated using the difference value, until the generated difference value reaches zero.

2. The test structure according to claim 1, wherein the first test resistors have the same electrical test resistance.

3. The test structure according to claim 2, wherein the devices under test have at least one structural element having an electrical characteristic in common, which structural element has a structural variation that differs between other devices under test.

4. The test structure according to claim 1, wherein the devices under test are comb-comb structures, which include several conducting comb lines with neighboring comb lines being arranged at a distance between them, and wherein the distance of neighboring comb lines varies from device to device among the devices under test.

5. The test structure according to claim 1, wherein each device under test has three terminals, a first and a second terminal being connected with the first and second conducting lines, respectively, and a third terminal, and wherein each third terminal of each device under test is connected in parallel to a control contact pad of the test structure.

6. The test structure of claim 5, wherein the devices under test are field effect transistors, wherein source and drain contacts of the field effect transistors form the first and second terminals of the devices under test, and wherein gate contacts of the field effect transistors form the third terminals of the devices under test.

7. The test structure according to claim 1, wherein the first test resistors are in series to the devices under test and have different known electrical test resistances for different devices under test, such that the total electrical resistance between the first and second test contact pads is indicative of each device under test that has the second electrical device resistance.

8. The test structure according to claim 1, wherein the respective first test resistors are in series with the devices under test and the resistance values of the first test resistors increase by an integer factor for each device under test.

9. The test structure according to claim 8, further comprising second test resistors in series with the devices under test, wherein the resistance values of the second test resistors increase by an integer factor for each device under test.

10. The test structure according to claim 1, wherein the first electrical device resistance of a respective device under test differs from the second electrical device resistance of the same respective device under test by at least a factor of 1000.

11. The test structure according to claim 1, wherein the devices under test include either comb-comb structures, or transistors, or diodes, or capacitors.

12. The test structure of claim 1, wherein the devices under test are transistors having different thicknesses.

13. A test method, comprising the steps of:
measuring a test quantity that is dependent on a total electrical resistance between a first and second test contact pads of a test structure;
determining a number of devices under test, which have an electrical device resistance indicating a defect state, from a measured test-quantity value,
wherein the test structure includes respective first test resistors and respective second test resistors connected in series between the respective devices under test and either the first or second test contact pad,
wherein the measurement step further comprises measuring a current flow between the first and second test contact pads at a given voltage between the first and second test contact pads,
wherein the determining step further comprises:
finding a particular device under test, wherein a current flow corresponding to the particular device under test is the largest from a subset of devices under test of the test structure, and wherein the current flow corresponding to the particular device under test is smaller than the measured current flow, and storing or outputting an identifier of the respective device under test;
generating a difference value by subtracting the current flow corresponding to the particular device under test from the measured current flow; and
repeating the finding step using the difference value, until the generated difference value reaches zero.

14. The test method according to claim 13, further comprising:
connecting first and second terminals to first and second conducting lines, respectively;
connecting a third terminal to a control contact pad of the test structure;
applying a control quantity to the control contact pad; and
varying the control quantity during the measurement of the measured current flow.

15. The test method according to claim 14, wherein the determining step further includes:
determining a total electrical conductance between the first and the second test contact pads;
subtracting known electrical test conductances of the first test resistors from the total electrical conductance, leading to a respective difference conductance value; and
raising a count index number by 1 for each subtracting step until the difference conductance value equals zero, wherein the first test resistors have the same electrical test resistance.

16. The test method according to claim 15, wherein the first test resistors are in series to the devices under test and have different known electrical test resistances for different devices under test, such that the total electrical resistance between the first and second test contact pads is indicative of each device under test that has the second electrical device resistance.

17. A testing method for testing at least two devices, wherein both devices include a first electrical device resistance in a non-defect state and a second electrical device resistance in a defect state, the first electrical device resistance being higher than the second electrical device resistance, the method comprising:
connecting the at least two devices under test in parallel and to a first test contact pad with a first conducting line;
connecting the at least two devices in parallel to a second test contact pad with a second conducting line;
connecting respective first test resistors in series between the respective devices under test and either the first or second conducting line, the first test resistors having known respective electrical test resistances such that a total electrical resistance between the first and second test contact pads is indicative of the number of devices under test;
connecting respective second test resistors in series between the respective devices under test and the first or second conducting line;
measuring a current flow between the first and second test contact pads at a given voltage between the first and second test contact pads; and
determining a number of devices under test, which have an electrical device resistance indicating a defect state, from a measured test-quantity value, wherein the determining step further comprises:
finding a particular device under test, wherein a current flow corresponding to the particular device under test is the largest from a subset of devices under test of the test structure, and wherein the current flow corresponding to the particular device under test is smaller than the measured current flow, and storing or outputting an identifier of the respective device under test;
generating a difference value by subtracting the current flow corresponding to the particular device under test from the measured current flow;
repeating the finding step using the difference value, until the generated difference value reaches zero.

* * * * *